US010811798B2

(12) United States Patent
Rossman

(10) Patent No.: US 10,811,798 B2
(45) Date of Patent: Oct. 20, 2020

(54) CARD EDGE CABLE CONNECTOR ASSEMBLY

(71) Applicant: TE CONNECTIVITY CORPORATION, Berwyn, PA (US)

(72) Inventor: Jared Evan Rossman, Dover, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/183,832

(22) Filed: Nov. 8, 2018

(65) Prior Publication Data

US 2020/0153135 A1 May 14, 2020

(51) Int. Cl.

*H01R 12/00* (2006.01)
*H05K 1/00* (2006.01)
*H01R 12/72* (2011.01)
*H01R 12/91* (2011.01)

(52) U.S. Cl.

CPC ........... *H01R 12/722* (2013.01); *H01R 12/91* (2013.01)

(58) Field of Classification Search

CPC .... H01R 12/722; H01R 12/728; H01R 12/91; H01R 13/74; H01R 13/743; H01R 13/745; H01R 9/0515; H01R 9/095

USPC ................ 439/325, 327, 59, 62, 78, 82, 636

See application file for complete search history.

(56) References Cited

U.S. PATENT DOCUMENTS 4,647,136 A * 3/1987 Kinoshita ............ H01R 12/722 439/571
6,000,953 A * 12/1999 Quillet ................ H01R 12/722 439/79
6,398,587 B1 * 6/2002 Chen .................. H01R 12/7023 439/607.35
6,790,047 B2 * 9/2004 Togashi ................ H01R 24/50 439/188
6,814,583 B1 11/2004 Young et al.
7,452,216 B2 11/2008 Murr et al.
7,458,826 B1 * 12/2008 Maatta ................ H01R 4/4809 439/79
7,534,146 B2 * 5/2009 Chien .................... H01R 24/58 439/668
8,007,290 B1 * 8/2011 Wolff ................ H01R 12/7011 439/78
8,083,526 B2 12/2011 Long
8,435,077 B2 5/2013 Yang
8,932,069 B2 * 1/2015 Kim ....................... H01R 13/73 439/79
9,899,756 B2 * 2/2018 Ootani ................ H01R 12/721
10,446,959 B2 * 10/2019 Groom ............... H01R 12/7064

(Continued)

*Primary Examiner* — Hae Moon Hyeon

(57) ABSTRACT

A card edge cable connector assembly includes a cable connector having a cable connector housing having a top, a bottom, a front, and a rear. The cable connector has a mating end and a cable end. The cable connector housing holds signal contacts and ground contacts. Cables are electrically connected to corresponding signal and ground contacts and extend from the cable end. The card edge cable connector assembly includes cable connector holder extending from the cable connector having a support wall with a support surface configured to engage a planar surface of a circuit card proximate to an edge slot at an edge of the circuit card to support the cable connector on the circuit card such that the cable connector and the cables are located in the edge slot of the circuit card.

20 Claims, 5 Drawing Sheets

(56) References Cited

U.S. PATENT DOCUMENTS

| | | | | |
|---|---|---|---|---|
| 2003/0207600 | A1* | 11/2003 | Ho | H01R 12/725 439/79 |
| 2012/0178272 | A1* | 7/2012 | Little | H01R 12/7047 439/55 |

* cited by examiner

CARD EDGE CABLE CONNECTOR ASSEMBLY

BACKGROUND OF THE INVENTION

The subject matter herein relates generally to cable connector assemblies.

Electrical connector systems typically utilize a receptacle connector and a header connector to connect electrical components, such as two circuit cards, such as a backplane and a daughtercard. In conventional backplane systems, the receptacle connector and the header connector are mounted to the respective circuit cards and mated during a mating operation to electrically connect the circuit cards. However, as data rates increase, some known systems have utilized cable connectors, rather than routing the signal paths through the backplane circuit board. For example, many cable connectors are held in a backplane rack and presented for interfacing with circuit cards, such as line cards and switch cards. The line cards and switch cards may have multiple electrical connectors mounted to the respective circuit card for interfacing with the rack of cable connectors.

Known electrical connector systems are not without disadvantages. For example, while known cable backplane systems eliminate circuit traces through a traditional backplane circuit board by utilizing the cable connectors, the systems still suffer from signal degradation along circuit traces through the line cards and the switch cards. Additionally, the systems design a large amount of floating movement into the cable connectors to accommodate for misalignment of the cable connectors relative to the board mounted connectors on the line cards and the switch cards.

A need remains for a robust and cost effective electrical connector system.

BRIEF DESCRIPTION OF THE INVENTION

In one embodiment, a card edge cable connector assembly is provided including a cable connector having a cable connector housing having a top, a bottom, a front, and a rear. The cable connector has a mating end at the front of the cable connector housing and a cable end with cables extending from the cable end. The cable connector housing holds signal contacts and ground contacts at the mating end of the cable connector. The cables being electrically connected to corresponding signal and ground contacts. The card edge cable connector assembly includes cable connector holder extending from the cable connector. The cable connector holder has a support wall for supporting the cable connector holder and the cable connector on a circuit card. The support wall has a support surface configured to engage a planar surface of the circuit card proximate to an edge slot at an edge of the circuit card to support the cable connector on the circuit card such that the cable connector and the cables are located in the edge slot of the circuit card.

In another embodiment, a card edge cable connector assembly is provided including a cable connector having a cable connector housing having a top, a bottom, a front, and a rear. The cable connector has a mating end at the front of the cable connector housing and holds signal contacts and ground contacts at the mating end. The cable connector has a cable end and cables extending from the cable end being electrically connected to corresponding signal and ground contacts. The card edge cable connector assembly includes a cable connector holder extending from the cable connector. The cable connector holder has side spacers, a top wall extending between the side spacers, and a bottom wall extending between the side spacers. The side spacers, the top wall, and the bottom wall define a connector cavity that receives the cable connector. The side spacers have card channels configured to receive a circuit card such that the cable connector holder is located in an edge slot at an edge of the circuit card. The side spacers have support walls along the card channels for supporting the cable connector holder on the circuit card such that the top wall is located above an upper surface of the circuit card and such that the bottom wall is located below a lower surface of the circuit card.

In a further embodiment, a card edge cable connector system is provided including a circuit card having an upper surface and a lower surface and having an edge slot at an edge of the circuit card open through the circuit card between the upper surface and the lower surface and open at the edge. The card edge cable connector system includes a card edge cable connector assembly received in the edge slot. The card edge cable connector assembly includes a cable connector and a cable connector holder extending from the cable connector. The cable connector has a cable connector housing having a top, a bottom, a front, and a rear. The cable connector has a mating end at the front of the cable connector housing. The cable connector has a cable end. The cable connector housing holds signal contacts and ground contacts at the mating end of the cable connector. The cable connector has cables extending from the cable end being electrically connected to corresponding signal and ground contacts. The cable connector holder has a support wall engaging the upper surface to support the cable connector holder and the cable connector on the circuit card such that the top of the cable connector housing is above the upper surface of the circuit card and such that the bottom of the cable connector housing is below the lower surface of the circuit card.

DETAILED DESCRIPTION OF THE INVENTION

Figure 1:
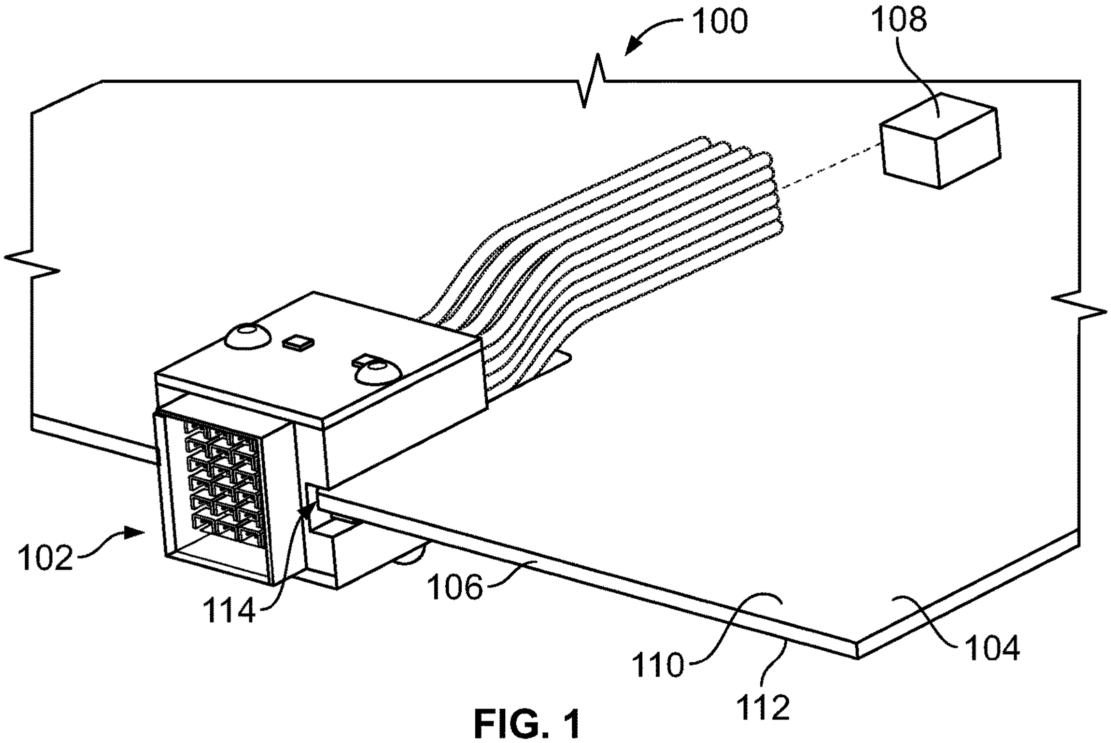
FIG. 1 is a perspective view of a card edge cable connector system in accordance with an exemplary embodiment.

FIG. 1 is a perspective view of a card edge cable connector system 100 in accordance with an exemplary embodiment. The card edge cable connector system 100 includes a card edge cable connector assembly 102 (or simply "cable connector assembly 102") and a circuit card 104. The cable connector assembly 102 is coupled to the circuit card 104 at an edge 106 of the circuit card 104. The cable connector assembly 102 is electrically connected to one or more electrical components 108 located remote from the edge 106 of the circuit card 104. The electrical components 108 may be mounted to a planar surface of the circuit card 104, such as to an upper surface 110 and/or a lower surface 112 of the circuit card 104. In other various embodiments, the electrical component 108 may be mounted to another circuit card or another component remote from the circuit card 104.

In an exemplary embodiment, the circuit card 104 includes an edge slot 114 at the edge 106 of the circuit card 104. The edge slot 114 is open through the circuit card 104 between the upper surface 110 and the lower surface 112. The edge slot 114 is open at the edge 106 to receive the cable connector assembly 102. In an exemplary embodiment, the cable connector assembly 102 is mounted to the circuit card 104 at the edge slot 114 such that the cable connector assembly 102 is located both above the upper surface 110 and below the lower surface 112.

Figure 2:
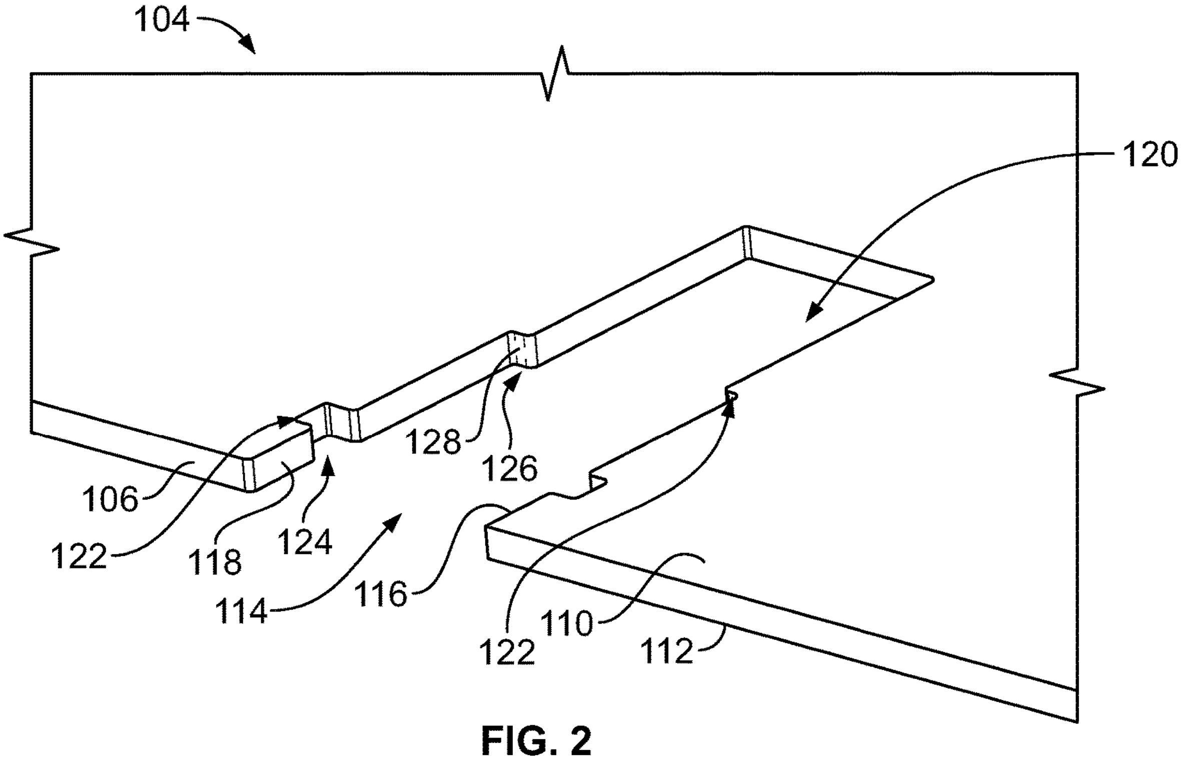
FIG. 2 is a perspective view of a circuit card of the card edge cable connector system in accordance with an exemplary embodiment.

FIG. 2 is a perspective view of a portion of the circuit card 104 in accordance with an exemplary embodiment. The circuit card 104 includes the edge slot 114 defined by side edges 116, 118 of the circuit card 104. The side edges 116, 118 face each other across the edge slot 114. The side edges 116, 118 extend between the upper surface 110 and the lower surface 112.

In an exemplary embodiment, the circuit card 104 includes a cable slot 120 rearward of the edge slot 114 that receives the cables of the cable connector assembly 102. The cable slot 120 allows routing of the cables from the rear end of the cable connector assembly 102 to the upper surface 110 and/or the lower surface 112. The cable slot 120 is an extension of the edge slot 114 and is located further from the edge 106 than the edge slot 114.

In an exemplary embodiment, the circuit card 104 includes one or more locating features 122 for locating the cable connector assembly 102 relative to the circuit card 104 and the edge slot 114. In an exemplary embodiment, the locating features 122 include cutouts 124 in the side edges 116, 118. The cutouts 124 are configured to receive portions of the cable connector assembly 102 to locate the cable connector assembly 102 relative to the circuit card 104. The cutouts 124 are located at a predetermined distance from the edge 106 to locate the cable connector assembly 102 relative to the edge 106. In an exemplary embodiment, the locating features 122 include shoulders 126 extending into the edge slot 114. The shoulders 126 include forward facing stop surfaces 128. The cable connector assembly 102 is configured to engage the forward facing stop surfaces 128 to locate the cable connector assembly 102 within the edge slot 114. The forward facing stop surfaces 128 are located at a predetermined distance from the edge 106 to locate the cable connector assembly 102 relative to the edge 106. Optionally, the shoulders 126 may be located between the edge slot 114 and the cable slot 120. For example, the edge slot 114 is located forward of the shoulders 126 and the cable slot 120 is located rearward of the shoulders 126. The cable slot 120 is narrower than the edge slot 114 in various embodiments. The circuit card 104 may include other types of locating features 122 in alternative embodiments. The locating features 122 may be located on the upper surface 110 and/or the lower surface 112 in addition to or rather than being located in the edge slot 114 in other various embodiments.

Figure 4:
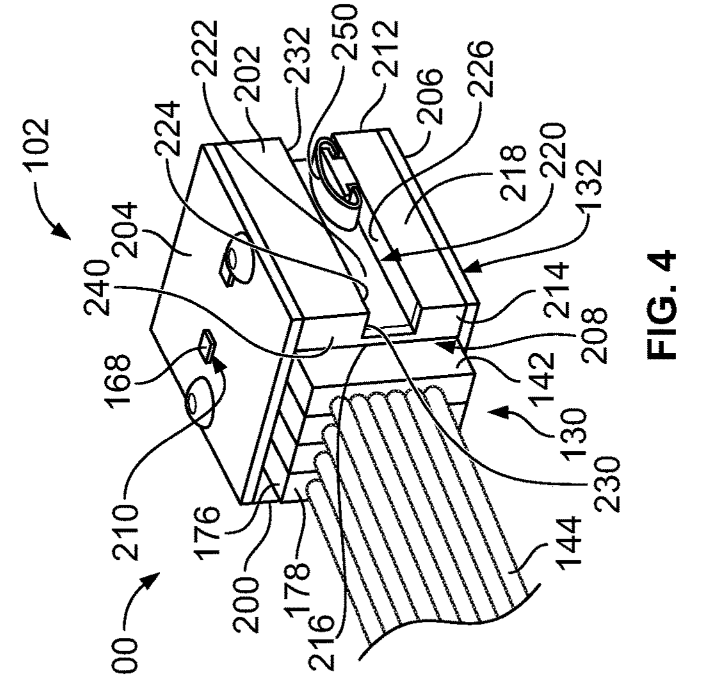
FIG. 4 is a rear perspective, assembled view of the card edge cable connector assembly in accordance with an exemplary embodiment.
Figure 3:
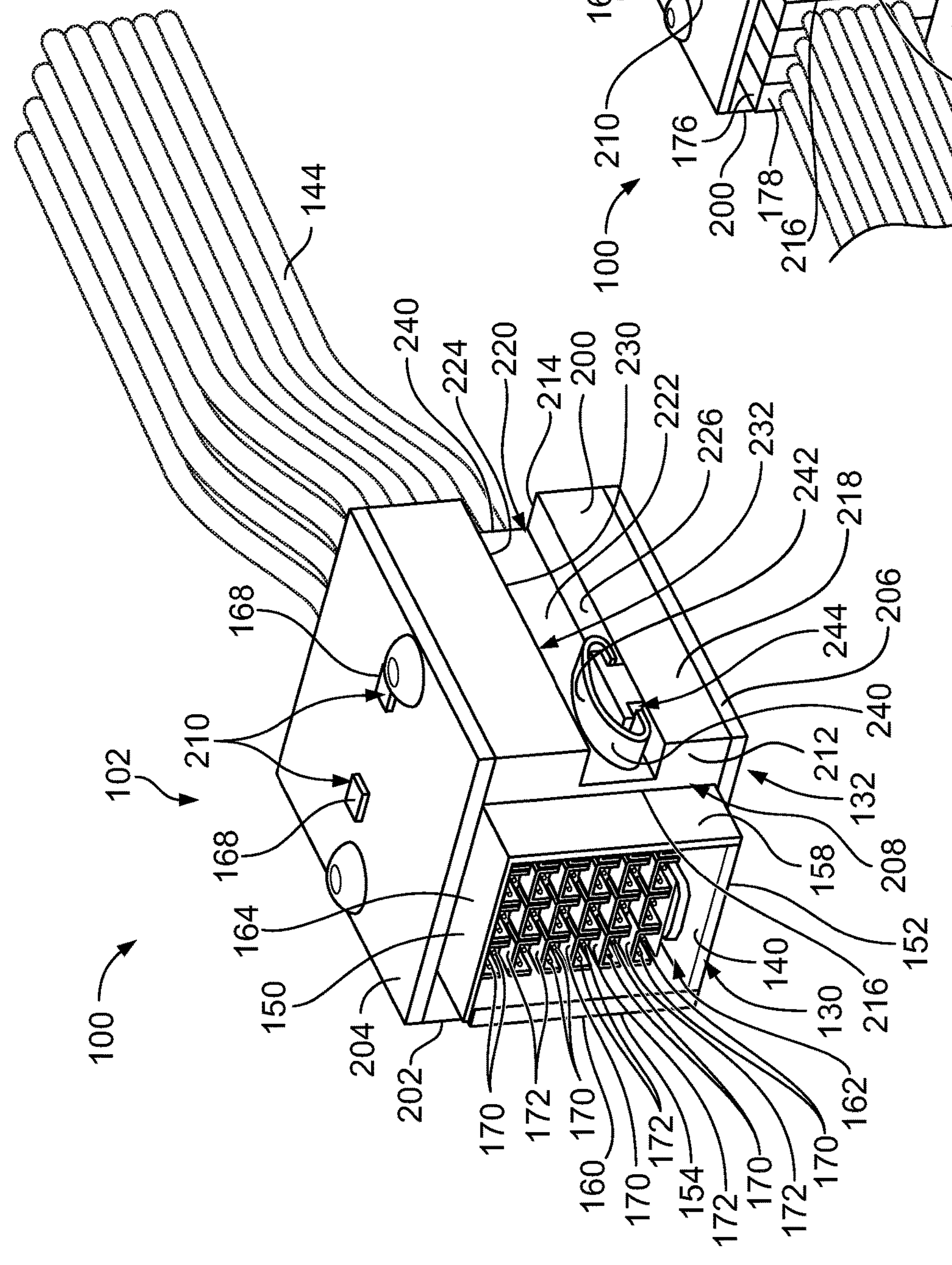
FIG. 3 is a front perspective, assembled view of the card edge cable connector assembly in accordance with an exemplary embodiment.
Figure 5:
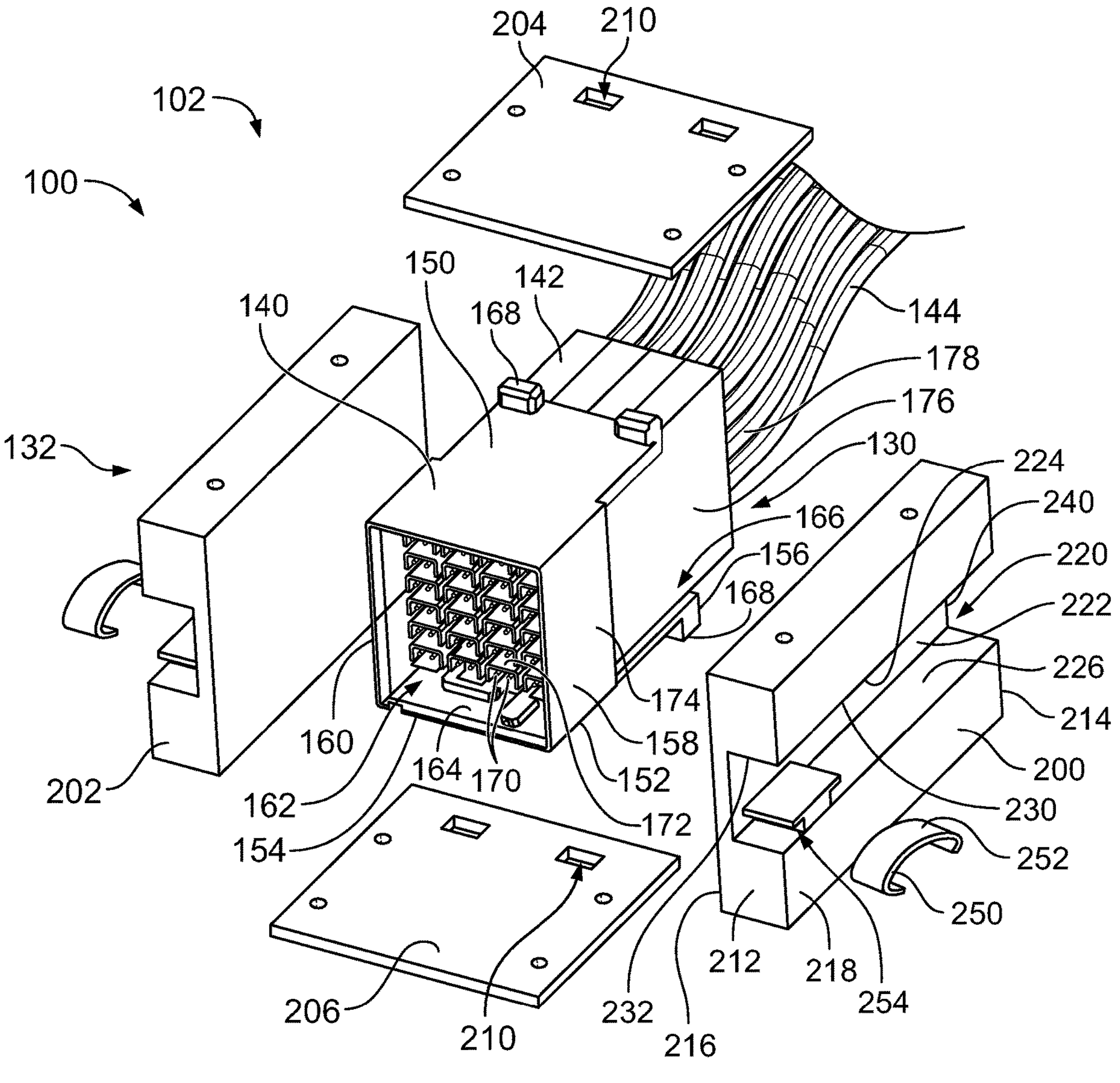
FIG. 5 is an exploded view of a card edge cable connector assembly of the card edge cable connector system in accordance with an exemplary embodiment.

FIG. 3 is a front perspective, assembled view of the card edge cable connector assembly 102 in accordance with an exemplary embodiment. FIG. 4 is a rear perspective, assembled view of the card edge cable connector assembly 102 in accordance with an exemplary embodiment. FIG. 5 is an exploded view of the card edge cable connector assembly 102 in accordance with an exemplary embodiment. The cable connector assembly 102 includes a cable connector 130 and a cable connector holder 132 extending from the cable connector 130. The cable connector holder 132 is used for supporting the cable connector 130 on the circuit card 104. The cable connector holder 132 is used for positioning the cable connector 130 relative to the circuit card 104, such as to position the cable connector 130 for mating with a mating electrical connector.

In an exemplary embodiment, the cable connector holder 132 is a separate structure from the cable connector 130 that receives and holds the cable connector 130. The cable connector holder 132 is coupled to the circuit card 104 for positioning the cable connector 130 relative to the circuit card 104. However, in other various embodiments, the cable connector holder 132 may be integrated with the cable connector 130. For example, the cable connector holder 132 may be molded with a portion of the cable connector 130 such that the cable connector holder 132 is an integral structure of the cable connector 130. In an exemplary embodiment, the cable connector holder 132 holds a single cable connector 130. However, in alternative embodiments, the cable connector holder 132 may hold multiple cable connectors 130 therein such that multiple cable connectors 130 may be positioned and held in the edge slot 114 by the cable connector holder 132.

The cable connector 130 includes a cable connector housing 140, one or more contact modules 142 received in the cable connector housing 140, and cables 144 extending from the contact modules 142. The cable connector housing 140 includes a top 150 and a bottom 152. The cable connector housing 140 includes a front 154 and a rear 156. The cable connector housing 140 includes a first side 158 and a second side 160. The cable connector housing 140 includes a contact cavity 162 at the front 154 defined by a shroud 164 extending along one or more sides of the contact cavity 162. For example, in the illustrated embodiment, the shroud 164 is rectangular and encloses the contact cavity 162 on four sides. The shroud 164 may have other shapes in alternative embodiments. In other various embodiments, rather than having a contact cavity 162, the cable connector housing 140 may include a front wall at the front 154. The cable connector housing 140 includes a cavity 166 at the rear 156 that receives the contact modules 142. In an exemplary embodiment, the cable connector housing 140 includes alignment tabs 168 extending from the top 150 and/or the bottom 152 and/or the sides 158, 160. The alignment tabs 168 are used to position the cable connector 130 within the cable connector holder 132.

In an exemplary embodiment, the cable connector 130 includes a plurality of the contact modules 142 arranged in a stacked configuration. The contact modules 142 may be box-shaped having sides that face and/or abut against each other. The contact module 142 includes signal contacts 170 and ground contacts 172 extending from a front 174 of the contact module 142. The cables 144 are configured to be terminated to corresponding signal contacts 170 and ground contacts 172. The signal contacts 170 and the ground contacts 172 are loaded into the contact cavity 162 when the contact module 142 is coupled to the cable connector housing 140. The signal contacts 170 and the ground contacts 172 are configured to be mated with a mating electrical connector. In an exemplary embodiment, the signal contacts 170 may be arranged in pairs, such as differential pairs. The ground contacts 172 may provide electrical shielding between the pairs. The ground contacts 172 provide an electrical reference and return path for the electrical signal. For example, in the illustrated embodiment, the ground contacts 172 include C-shaped shields providing shielding on three sides of each pair of signal contacts 170. The ground contacts 172 may have other shapes in alternative embodiments. In the illustrated embodiment, the signal contacts 170 include pins at mating ends thereof. However, other types of signal contacts 170 may be provided in alternative embodiments, such as sockets, spring beams, tuning fork contacts, and the like.

In an exemplary embodiment, the contact module 142 includes a frame 176 that holds the signal contacts 170 and the ground contacts 172. Optionally, the frame 176 may be dielectric to electrically isolate the signal contacts 170 from each other and/or from the ground contacts 172. In various embodiments, the frame 176 may be an overmolded formed around the signal contacts 170, the ground contacts 172 and the cables 144. The cables 144 extend rearward from a rear 178 of the frame 176. Portions of the cables 144 may extend into the frame 176. For example, portions of the cables 144 may be embedded in the frame 176. For example, the cables 144 may be overmolded by the frame 176. The frame 176 provides strain relief for the cables 144. Optionally, the contact module 142 may include a shield structure to provide electrical shielding for the signal contacts 170 and/or the cables 144. For example, a separate stamped and formed shield may be coupled to one or both sides of the frame 176. In other various embodiments, the frame 176 may be a metallized with a conductive layer on the exterior of the frame 176 to provide electrical shielding.

In an exemplary embodiment, a plurality of the cables 144 extends from each of the contact modules 142. Optionally, each cable 144 may be a twinaxial cable having a pair of signal conductors terminated to the corresponding pair of signal contacts 170. In alternative embodiments, the cables 144 may be coaxial cables. Other types of cables may be provided in alternative embodiments. The conductors of the cables 140 are terminated to the signal contacts 170. For example, the conductors may be soldered to the signal contacts 170, crimped to the signal contacts 170, or terminated by other means, such as insulation displacement connections, and the like.

The cable connector holder 132 includes one or more walls extending from the cable connector 130 for engaging and supporting the cable connector 130 relative to the circuit card 104. In an exemplary embodiment, the cable connector holder 132 includes a first side spacer 200, a second side spacer 202, a top wall 204, and a bottom wall 206. The top wall 204 and the bottom wall 206 extend between the first and second side spacers 200, 202. The top wall 204 is coupled to the first and second side spacers 200, 202, such as using fasteners. The bottom wall 206 is coupled to the first and second side spacers 200, 202, such as using fasteners. The side spacers 200, 202, the top wall 204, and the bottom wall 206 define a connector cavity 208 that receives the cable connector 130. Optionally, the connector cavity 208 may be sized to receive more than one cable connector 130 therein. For example, the top and bottom walls 204, 206 may be elongated to widen the connector cavity 208 to receive multiple cable connectors 130. Optionally, additional side spacers may be provided between one or more cable connectors 130 within the connector cavity 208.

In an exemplary embodiment, the top wall 204 and the bottom wall 206 are metal plates cut to a size corresponding to a width of the cable connector 130, or the widths of the multiple cable connectors 130 when multiple cable connectors 130 are to be loaded in the connector cavity 208. The widths of the top wall 204 and the bottom wall 206 may be selected to control the spacing or width between the side spacers 200, 202. In an exemplary embodiment, the top wall 204 and the bottom wall 206 include alignment openings 210 that receive corresponding alignment tabs 168 of the cable connectors 130. The alignment tabs 168 may be captured in the alignment openings 210 to hold the relative position of the cable connector 130 to the cable connector holder 132. Optionally, the alignment openings 210 may be oversized relative to the alignment tabs 168 in one or more directions to allow a limited amount of floating movement of the alignment tabs 168 within the alignment openings 210 in the one or more directions. The floating movement allows a limited amount of movement of the cable connector 130 relative to the cable connector holder 132, such as for aligning with the mating electrical connector. The floating movement defines alignment tolerance within the card edge cable connector system 100.

The side spacers 200, 202 may be metal blocks or plastic blocks having a height corresponding to a height of the cable connector 130. For example, the height of the side spacers 200, 202 may correspond to the height of the cable connector housing 140 between the top 150 and the bottom 152. The side spacers 200, 202 control the vertical positioning of the top wall 204 relative to the bottom wall 206 for receiving the cable connector(s) therebetween.

In an exemplary embodiment, the side spacers 200, 202 extend between a front 212 and a rear 214. The side spacers 200, 202 include an interior 216 and an exterior 218. In an exemplary embodiment, the side spacers 200, 202 include card channels 220 in the exterior 218 thereof. The card channels 220 extend between the front 212 and the rear 214. The card channels 220 are configured to receive the circuit card 104. Each card channel 220 is defined by an inner end 222, a top wall 224, and the bottom wall 226. The circuit card 104 is configured to fit between the top wall 224 and the bottom wall 226. Optionally, the card channel 220 may have a height between the top wall 224 and the bottom wall 226 greater than a thickness of the circuit card 104 to allow variable positioning of the cable connector holder 132 relative to the circuit card 104.

In an exemplary embodiment, the top wall 224 defines a support wall 230 for the cable connector holder 132 for supporting the cable connector holder 132 on the circuit card 104. For example, the support wall 230 includes a downward facing support surface 232 configured to engage the upper surface 110 of the circuit card 104. The support surface 232 of the cable connector holder 132 rests on the circuit card 104.

In an exemplary embodiment, the side spacers 200, 202 include stop surfaces 240 configured to engage the circuit card 104 to position the cable connector holder 132 relative to the circuit card 104. In the illustrated embodiment, the stop surface 240 is defined by the rear 214 of the side spacer 200, 202. Other surfaces of the side spacer 200, 202 may define a stop surface 240. In an exemplary embodiment, the stop surface 240 is configured to engage the stop surface 128 of the circuit card 104.

In an exemplary embodiment, the cable connector holder 132 includes a spring 250 in the card channel 220 configured to engage the circuit card 104. The spring 250 biases the cable connector holder 132 downward on the circuit card 104 to force the support surface 232 against the circuit card 104. For example, the spring 250 includes a spring interface 252 that presses against the lower surface 112 of the circuit card 104 to bias the cable connector holder 132 downward against the circuit card 104. The spring 250 is coupled to the corresponding side spacer 200, 202 in the card channel 220. For example, the card channel 220 may include one or more grooves 254 that receive ends of the spring 250.

Figure 6:
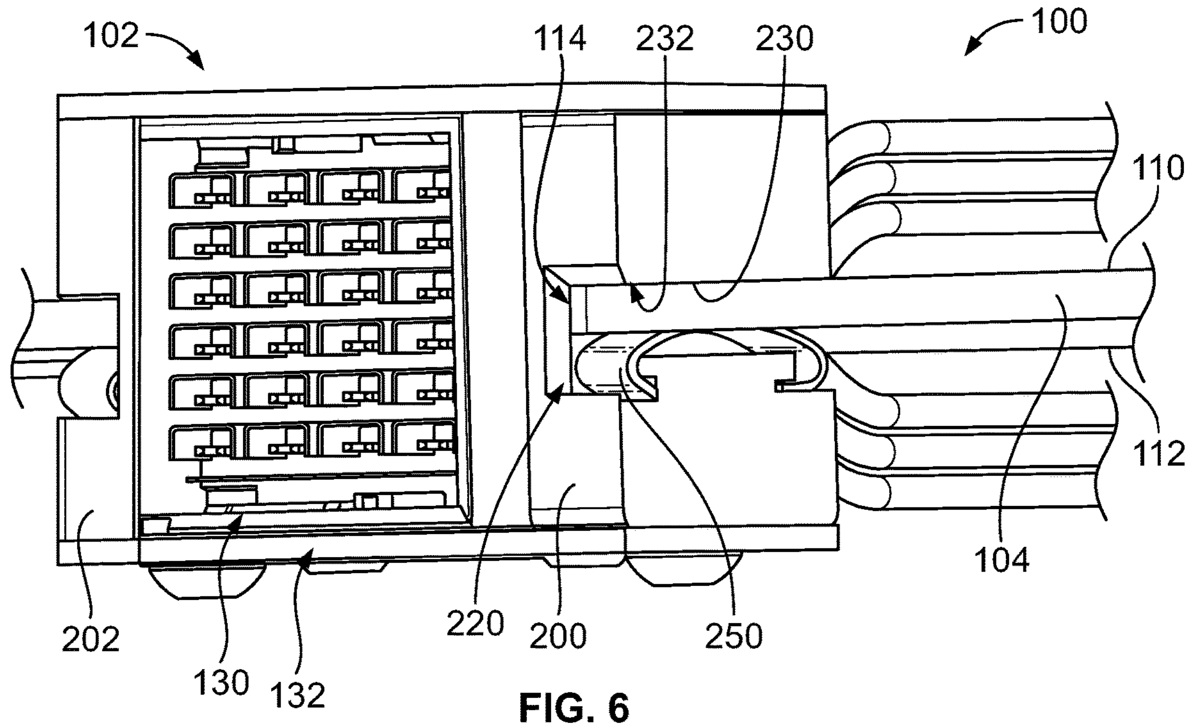
FIG. 6 is a perspective view of a portion of the card edge cable connector system in accordance with an exemplary embodiment.

FIG. 6 is a perspective view of a portion of the card edge cable connector system 100 in accordance with an exemplary embodiment. FIG. 6 illustrates the cable connector assembly 102 coupled to the circuit card 104. The cable connector 130 and the cable connector holder 132 are received in the edge slot 114 of the circuit card 104. In an exemplary embodiment, the card channel 220 is approximately centered between the tops and the bottoms of the side spacers 200, 202. As such, a portion of the cable connector assembly 102 may be lowered into the edge slot 114 to reduce the vertical height of the card edge cable connector system 100 above the circuit card 104. For example, a portion of the cable connector assembly 102 may be located below the lower surface 112 of the circuit card 104. Optionally, as in the illustrated embodiment, the cable connector assembly 102 may be approximately centered relative to the circuit card 104 such that a vertical height of the cable connector assembly 102 above the upper surface 110 of the circuit card 104 is approximately equal to a vertical height of the cable connector assembly 102 below the lower surface 112 of the circuit card 104.

In an exemplary embodiment, the spring 250 is used to position the cable connector holder 132 relative to the circuit card 104. For example, the spring 250 biases against the lower surface 112 of the circuit card 104. The spring 250 forces the cable connector holder 132 downward relative to the circuit card 104 to force the support surface 232 of the support wall 230 against the upper surface 110 of the circuit card 104. In an exemplary embodiment, the spring 250 allows floating movement of the cable connector holder 132, and thus the cable connector 130, relative to the circuit card 104. For example, the cable connector holder 132 and thus the cable connector 130 may move upward during mating with the mating electrical component. The cable connector 130 is thus allowed to float relative to the circuit card 104 in a vertical direction for alignment with the mating electrical component. In an exemplary embodiment, the spring 250 is configured to be received in the corresponding cutout 124 (shown in FIG. 2) in the circuit card 104 to axially locate the cable connector assembly 102 relative to the circuit card 104 and the edge slot 114. For example, the spring interface 252 is shaped to rest in the cutout 124 to resist pullout of the cable connector assembly 102 from the edge slot 114. The spring force may be overcome to allow removal of the cable connector assembly 102 from the circuit card 104, such as for repair or replacement of the cable connector assembly 102. When the cable connector assembly 102 is loaded in the edge slot 114, the stop surface 240 at the rear 214 of the side spacer 200 engages the corresponding stop surface 128 (shown in FIG. 2) to limit or stop rearward movement of the cable connector assembly 102 and the edge slot 114, such as during mating with the mating electrical component.

Figure 7:
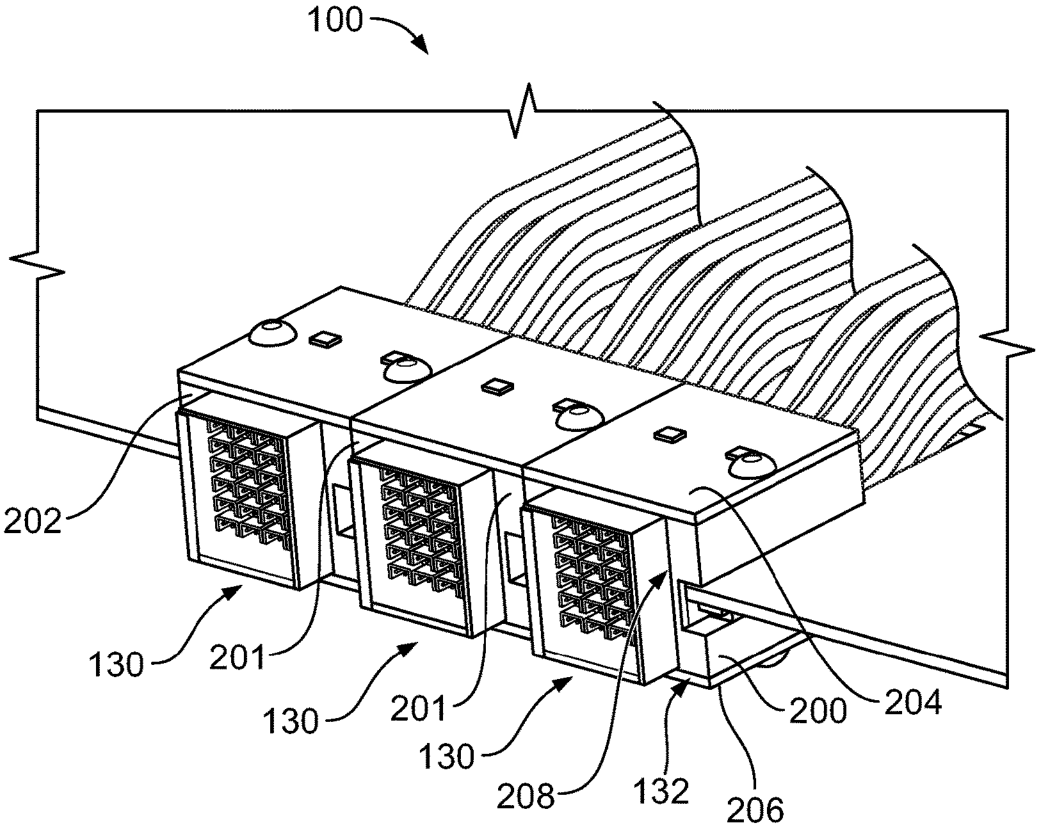
FIG. 7 is a front perspective view of the card edge cable connector system in accordance with an exemplary embodiment.

FIG. 7 is a front perspective view of the card edge cable connector system 100 in accordance with an exemplary embodiment. FIG. 7 shows a plurality of cable connectors 130 in the connector cavity 208 of the cable connector holder 132. The cable connectors 130 are arranged side-by-side. In an exemplary embodiment, a spacer 201 is located in the connector cavity 208 between corresponding cable connectors 130. The spacer 201 may be similar to the side spacers 200, 202 and extend between the top wall 204 and the bottom wall 206. The spacer 201 locates the cable connectors 130 relative to each other.

Figure 8:
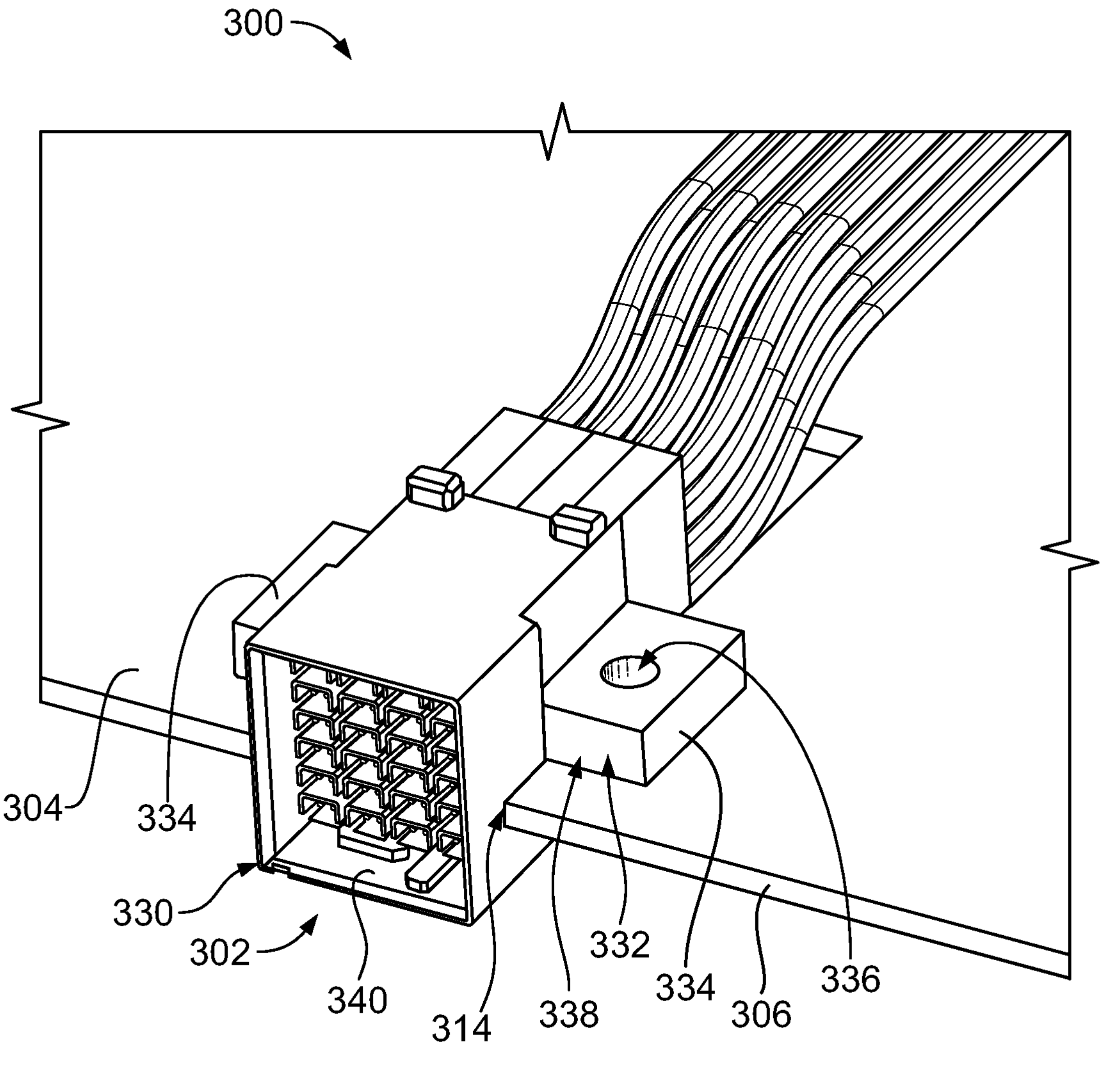
FIG. 8 is a perspective view of a card edge cable connector system in accordance with an exemplary embodiment.

FIG. 8 is a perspective view of a card edge cable connector system 300 in accordance with an exemplary embodiment. The card edge cable connector system 300 is similar to the card edge cable connector system 100 (shown in FIG. 1). The card edge cable connector system 300 include similar components, however, the card edge cable connector system 300 includes a different type of cable connector holder for holding the cable connector relative to the circuit card.

The card edge cable connector system 300 includes a card edge cable connector assembly 302 mounted to a circuit card 304 at an edge 306 of the circuit card 304. The cable connector assembly 302 is received in an edge slot 314 of the circuit card 304. The cable connector assembly 302 includes a cable connector 330 and a cable connector holder 332. The cable connector 330 is similar to the cable connector 130. The cable connector holder 332 is integral with a cable connector housing 340 of the cable connector 330. For example, the cable connector holder 332 is co-molded with the cable connector housing 340. The cable connector holder 332 extends outward from the sides of the cable connector housing 340. The cable connector holder 332 includes mounting tabs 334 having openings 336 therethrough. The mounting tabs 334 have support walls 338 defining support surfaces on lower surfaces of the mounting tabs 334. The openings 336 are configured to receive fasteners, such as screws or bolts to secure the mounting tabs 334 to the circuit card 304. Optionally, the openings 336 may be oversized relative to the fasteners to allow a limited amount of floating movement in one or more directions of the cable connector holder 332 and thus the cable connector 330 relative to the circuit card 304. The floating movement allows the cable connector 330 to be aligned with the mating electrical component during mating.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A card edge cable connector assembly comprising:

a cable connector having a cable connector housing, the cable connector housing having a top and a bottom, the cable connector housing having a front and a rear, the cable connector having a mating end at the front of the cable connector housing, the cable connector having a cable end, the cable connector housing holding signal contacts and ground contacts at the mating end of the cable connector, the cable connector having cables extending from the cable end, the cables being electrically connected to corresponding signal and ground contacts; and a cable connector holder extending from the cable connector, the cable connector holder having a support wall for supporting the cable connector holder and the cable connector on a circuit card, the support wall having a support surface configured to engage a planar surface of the circuit card proximate to an edge slot at an edge of the circuit card to support the cable connector on the circuit card such that the cable connector and the cables are located in the edge slot of the circuit card.

2. The card edge cable connector assembly of claim 1, wherein the cable connector holder includes a spring configured to engage the circuit card to allow the cable connector holder to move relative to the circuit card.

3. The card edge cable connector assembly of claim 1, wherein the support wall of the cable connector holder is slidable along an upper surface of the circuit card for loading and unloading the cable connector into and out of the edge slot.

4. The card edge cable connector assembly of claim 1, wherein the cable connector holder includes a card channel configured to receive a side edge of the circuit card extending along the edge slot, the support wall defining a top of the card channel.

5. The card edge cable connector assembly of claim 4, wherein the card channel is approximately centered between the top of the cable connector housing and the bottom of the cable connector housing.

6. The card edge cable connector assembly of claim 1, wherein the support surface is located at a predetermined height relative to the top of the cable connector housing and the bottom of the cable connector housing to define a reference surface of the card edge cable connector assembly for locating the cable connector relative to the circuit card.

7. The card edge cable connector assembly of claim 1, wherein the support surface is located below the top of the cable connector housing and located above the bottom of the cable connector housing.

8. The card edge cable connector assembly of claim 1, wherein the cable connector holder includes a stop surface different than the support surface configured to engage the circuit card in the edge slot to locate the cable connector holder relative to the circuit card.

9. The card edge cable connector assembly of claim 1, wherein the cable connector holder includes side spacers, a top wall extending between the side spacers, and a bottom wall extending between the side spacers, the side spacers, the top wall, and the bottom wall defining a connector cavity receiving the cable connector, and the side spacers having card channels configured to receive the circuit card, wherein the support wall defines a top of each of the card channels.

10. The card edge cable connector assembly of claim 1, wherein the cable connector holder includes a connector cavity, the cable connector received in the connector cavity.

11. The card edge cable connector assembly of claim 10, wherein the cable connector is a first cable connector, the card edge cable connector assembly further comprising a second cable connector received in the connector cavity of the cable connector holder.

12. The card edge cable connector assembly of claim 1, wherein the cable connector holder is integral with the cable connector housing.

13. A card edge cable connector assembly comprising:

a cable connector having a cable connector housing, the cable connector housing having a top and a bottom, the cable connector housing having a front and a rear, the cable connector having a mating end at the front of the cable connector housing, the cable connector having a cable end, the cable connector housing holding signal contacts and ground contacts at the mating end of the cable connector, the cable connector having cables extending from the cable end, the cables being electrically connected to corresponding signal and ground contacts; and a cable connector holder extending from the cable connector, the cable connector holder having side spacers, a top wall extending between the side spacers, and a bottom wall extending between the side spacers, the side spacers, the top wall, and the bottom wall defining a connector cavity, the connector cavity receives the cable connector, the side spacers having card channels configured to receive a circuit card such that the cable connector holder is located in an edge slot at an edge of the circuit card, the side spacers having support walls along the card channels for supporting the cable connector holder on the circuit card such that the top wall is located above an upper surface of the circuit card and such that the bottom wall is located below a lower surface of the circuit card.

14. The card edge cable connector assembly of claim 13, wherein the cable connector holder includes a spring in the card channel configured to engage a planar surface of the circuit card to allow the cable connector holder to move relative to the circuit card.

15. A card edge cable connector system comprising:

a circuit card having an upper surface and a lower surface, the circuit card having an edge slot at an edge of the circuit card open through the circuit card between the upper surface and the lower surface, the edge slot being open at the edge; and a card edge cable connector assembly received in the edge slot, the card edge cable connector assembly including a cable connector and a cable connector holder extending from the cable connector, the cable connector having a cable connector housing having a top and a bottom, the cable connector housing having a front and a rear, the cable connector having a mating end at the front of the cable connector housing, the cable connector having a cable end, the cable connector housing holding signal contacts and ground contacts at the mating end of the cable connector, the cable connector having cables extending from the cable end, the cables being electrically connected to corresponding signal and ground contacts, the cable connector holder having a support wall engaging the upper surface of the circuit card to support the cable connector holder and the cable connector on the circuit card such that the top of the cable connector housing is above the upper surface of the circuit card and such that the bottom of the cable connector housing is below the lower surface of the circuit card.

16. The card edge cable connector system of claim 15, wherein the circuit card is approximately centered between the top of the cable connector housing and the bottom of the cable connector housing.

17. The card edge cable connector system of claim 15, wherein the circuit card includes a cable slot rearward of the edge slot, the cables extending from the cable connector into the cable slot.

18. The card edge cable connector system of claim 15, wherein a first set of the cables are routed from the cable connector along the upper surface to a first electrical component on the upper surface of the circuit card remote from the edge slot, and wherein a second set of the cables are routed from the cable connector along the lower surface to a second electrical component on the lower surface of the circuit card remote from the edge slot.

19. The card edge cable connector system of claim 15, wherein the cable connector is a first cable connector, the cable connector holder holding a second cable connector in the edge slot.

20. The card edge cable connector system of claim 15, wherein the circuit card includes a forward facing stop surface in the edge slot, the card edge cable connector assembly engaging the forward facing stop surface to locate the card edge cable connector assembly in the edge slot.

* * * * *